United States Patent
Tran et al.

(10) Patent No.: US 8,705,310 B2
(45) Date of Patent: Apr. 22, 2014

(54) ACCESS METHODS AND CIRCUITS FOR MEMORY DEVICES HAVING MULTIPLE BANKS

(71) Applicant: Cypress Semiconductor Corporation, San Jose, CA (US)

(72) Inventors: Thinh Tran, Palo Alto, CA (US); Joseph Tzou, Mountain View, CA (US); Jun Li, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/727,505

(22) Filed: Dec. 26, 2012

(65) Prior Publication Data
US 2014/0056093 A1    Feb. 27, 2014

Related U.S. Application Data (60) Provisional application No. 61/693,090, filed on Aug. 24, 2012.

(51) Int. Cl.
*G11C 8/12*      (2006.01)

(52) U.S. Cl.
USPC ............ 365/230.03; 365/154; 365/189.19; 365/233.11; 365/233.13

(58) Field of Classification Search
USPC ............ 365/154, 189.04, 189.19, 230.03, 365/233.11, 233.13
See application file for complete search history.

(56) References Cited

U.S. PATENT DOCUMENTS

| | | | |
|---|---|---|---|
| 5,875,470 A | 2/1999 | Dreibelbis et al. | |
| 6,166,946 A | 12/2000 | Naffziger | |
| 6,205,523 B1 | 3/2001 | Joffe et al. | |
| 6,272,067 B1 | 8/2001 | Sun et al. | |
| 6,314,047 B1 | 11/2001 | Keay et al. | |
| 6,489,819 B1* | 12/2002 | Kono et al. | 327/141 |
| 6,584,036 B2 | 6/2003 | Kurjanowicz et al. | |
| 6,600,693 B2 | 7/2003 | Kim | |
| 6,745,277 B1 | 6/2004 | Lee et al. | |
| 6,967,861 B2 | 11/2005 | Braceras et al. | |
| 7,142,477 B1 | 11/2006 | Tran et al. | |
| 7,653,780 B2 | 1/2010 | Takahashi | |
| 7,990,973 B2 | 8/2011 | Hao et al. | |
| 8,149,643 B2 | 4/2012 | Tzou et al. | |
| 2001/0017792 A1* | 8/2001 | Takahashi et al. | 365/189.07 |

(Continued)

FOREIGN PATENT DOCUMENTS

JP    2009059452 A    3/2009

OTHER PUBLICATIONS

English machine translation of JP2009059452, taken from Internet:http://worldwide.espacenet.com.

(Continued)

*Primary Examiner* — Huan Hoang
*Assistant Examiner* — Jay Radke (57) ABSTRACT

A method can include storing bank addresses, if received, on at least rising and falling edges of a same clock cycle; and if addresses stored on the rising and falling edges of the same clock cycle correspond to different banks of a memory device, starting accesses to both banks after the falling edge of the clock cycle; wherein any of the banks can be accessed in response to an address stored on a rising edge of a next clock cycle. Devices and additional methods are also disclosed.

20 Claims, 8 Drawing Sheets

(56) References Cited

U.S. PATENT DOCUMENTS

2005/0210215 A1    9/2005   Sezaki et al.
2006/0292292 A1*  12/2006   Brightman et al. ............. 427/66
2010/0103762 A1*   4/2010   Tzou et al. ............... 365/230.03
2012/0008378 A1    1/2012   Maheshwari
2012/0243301 A1*   9/2012   Maheshwari et al. ........ 365/154

OTHER PUBLICATIONS

Altera Corporation, "QDR SRAM Controller Function", Application Note 133, ver 1.0, Dec. 2000.

Altera Corporation, "QDR SRAM Controller Reference Design for Stratix & Stratix FX Devices", Application Note 349, ver 1.0, May 2004.

White Electronics Design Corporation, "SSRAM Overview Application Note", Oct. 2001.

"Interfacing XILINX/SPARTAN-II FPGA", found at Internet:http://www.datashets.org.uk/CY7C1302_CY7C1304/Datasheet-09/DSA0015448.html.

USPTO Final Rejection for U.S. Appl. No. 13/179,307 dated Aug. 21, 2013; 32 pages.

USPTO Non-Final Rejection for U.S. Appl. No. 13/179,307 dated Feb. 19, 2013; 16 pages.

* cited by examiner

ACCESS METHODS AND CIRCUITS FOR MEMORY DEVICES HAVING MULTIPLE BANKS

This application claims the benefit of U.S. provisional patent application Ser. No. 61/693,090 filed on Aug. 24, 2012, the contents of which are incorporated by reference herein.

TECHNICAL FIELD

The present disclosure relates generally to memory devices, and more particularly to bank access methods for memory devices.

BACKGROUND

Memory devices, such as quad data rate static random access memories (SRAMs) can latch address values on both rising and falling edges of a timing clock for high speed, high throughput operations.

Figure 10A:
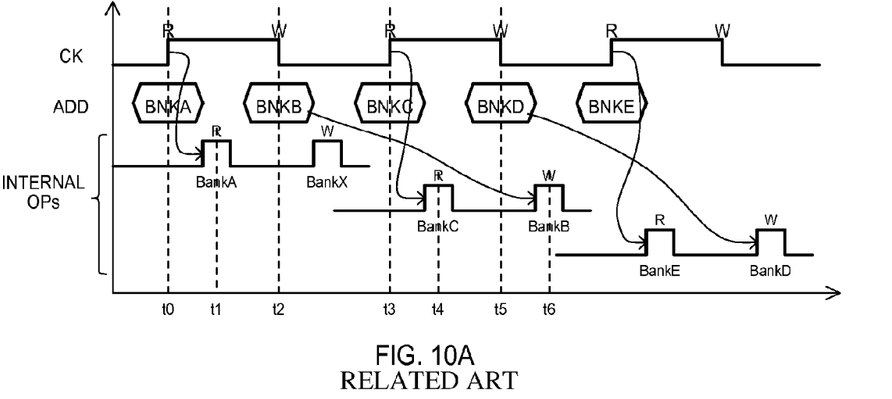
FIGS. 10A to 10C are timing diagrams showing conventional bank access operations and limitations.

FIG. 10A is a timing diagram showing bank accesses for a conventional quad data rate SRAM device. FIG. 10A has waveforms for a timing clock CK, latched address values ADD, and operations within banks (Internal Ops). Letters "R" and "W" shown above waveform CK indicate the application of read and write commands. Letters "R" and "W" above the Internal Ops waveforms show the type of bank access executed within a bank.

Referring to FIG. 10A, at time t0, a read command can be received for an address in one bank (BNKA) on a rising edge of CK. At time t1, in response to the read command at time t0, the bank (BankA) can be accessed for a read operation. Referring still to FIG. 10A, at time t2 a write command can be received for an address in another bank (BNKB) on a falling edge of CK. Such a write operation is not executed until a subsequent cycle (at time t6).

At time t3, another read command can be received on the next rising edge of CK. At time t4, the corresponding bank (BankC) can be accessed for the read operation.

At time t5, another write command can be received.

At time t6, a write operation in BankB can be performed in response to the bank address latched at time t2.

It is noted that in operations performed at the access speeds shown in FIG. 10A, there are no restrictions on bank addresses, as there is sufficient time between received commands (R and W of CK), as compared to the time needed to execute read and write operations within a bank (consecutive read and write operation of INTERNAL OPs).

Figure 10B:
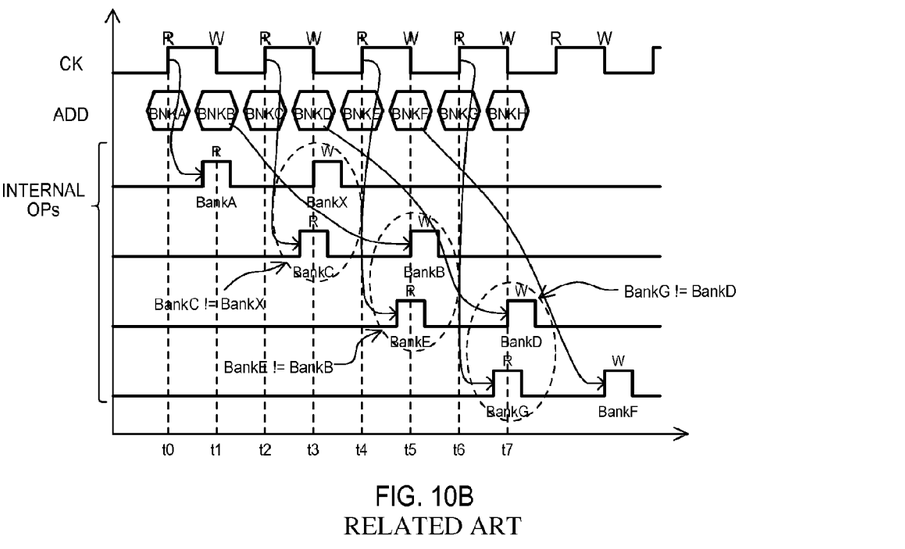

FIG. 10B is a timing diagram showing bank accesses for a conventional quad data rate SRAM device, like that of FIG. 10A, but at a higher clock speed. FIG. 10B shows the same waveforms as FIG. 10A.

Referring to FIG. 10B, at time t3, a read operation can be executed in the bank latched at time t2. However, in the same general time period, a write operation to a BankX is being performed in response to a write command to BankX, issued in a previous clock cycle. Accordingly, the write operation to BankX and the read operation to BankC overlap one another.

Similarly, at time t5, the read operation to BankE (corresponding to BNKE latched at time t4) overlaps the write operation to BankB (corresponding to BNKB latched at time t1, in a previous cycle). At time at time t7, the read operation to BankG (corresponding to BNKG latched at time t6) overlaps the write operation to BankD (corresponding to BNKD latched at time t3, in a previous cycle).

To ensure proper operations, restrictions are placed on bank addresses so that the same bank is not subject to the overlapping read and write operations. Accordingly, as shown in FIG. 10B, BankC is restricted to not being the same as BankX (BankC !=BankX). Similarly, BankE !=BankB and BankG !=BankD.

Conventionally, to ensure such bank restrictions are maintained, a memory device can compare a read bank address (received on a rising edge of CK) to write bank addresses received in a previous clock cycle.

Figure 10C:
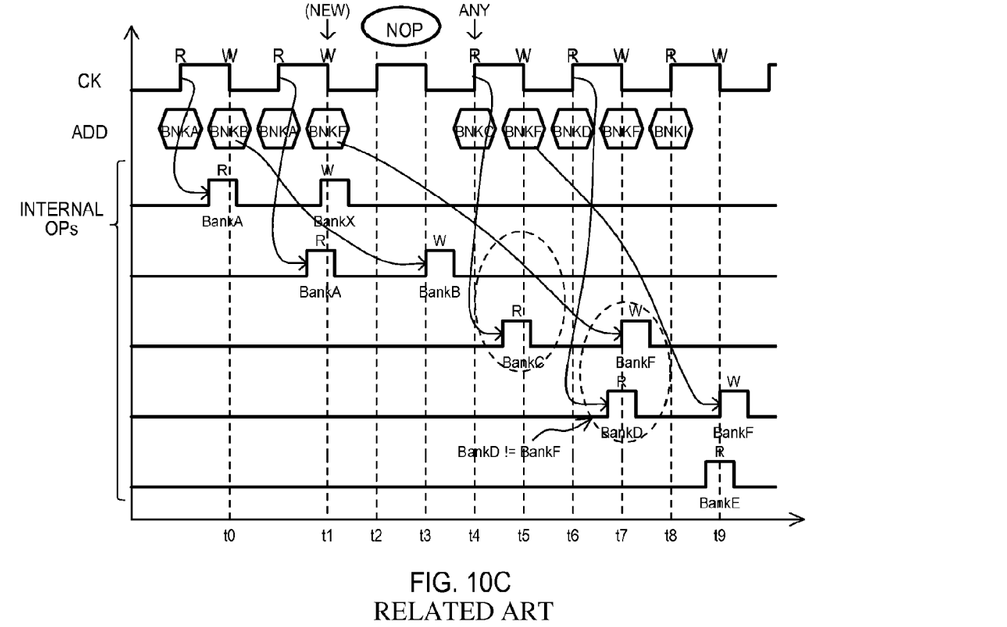

FIG. 10C shows a further restriction on a high speed memory device like that of FIG. 10B. FIG. 10C is a timing diagram showing how a write bank address can be switched in a conventional quad data rate SRAM. FIG. 10C shows the same waveform as FIG. 10B; however, unlike FIG.10B, after the write to BankB at time t0, it is desired to switch to a new bank (BankF).

To ensure sufficient time is provided for comparing addresses, a "no operation" (NOP) cycle is inserted between times t2 and t3. It is understood that the access to BankF is delayed due to the insertion of the NOP cycle until time t7.

At time t4, following the NOP cycle, a read operation can be to any bank, as there is no possible overlapping write operation. Following time t4, read and write operations can continue as described, but with restrictions being based on the new write bank (BankF) received at time t1.

Accordingly, in response to a read operation at time t6, the corresponding BankD can be accessed for a read operation, but such a bank must be different from BankF, being accessed in response to the new write bank received at time t1.

DETAILED DESCRIPTION

Various embodiments will now be described that include memory devices that enable accesses to multiple banks in response to more than one address received in a same clock cycle. Unlike conventional memory devices, bank accesses can be considerably less restrictive, only requiring accesses within a same cycle being limited to different banks. Banks accessed in previous cycles are not considered.

Figure 1A:
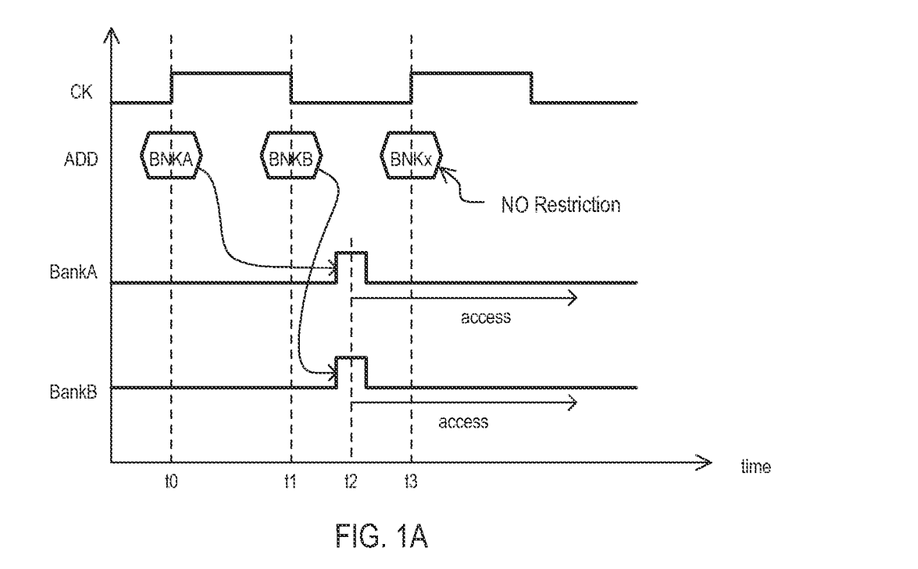
FIGS. 1A and 1B are timing diagrams showing bank access operations and limitations according to embodiments.

FIG. 1A is a timing diagram showing bank accesses and restrictions for a memory device according to embodiment.

FIG. 1A has waveforms for a timing clock CK, latched bank address values ADD, and operations within banks (BankA, BankB).

Referring to FIG. 1A, at time t0 a first command can be received for an address in one bank (BNKA) on a rising edge of CK. Unlike, a conventional operation, like that of FIG. 10A, an operation does not begin prior to the falling edge of the same cycle. Further, as will be described in more detail below, the address (BNKA) is not compared to any previous address to determine if the access is valid.

At time t1, in the same clock cycle, a second command can be received for an address on another bank (BNKB) on a falling edge of CK. An address received on a falling edge can be compared to that received on the rising edge of the same clock cycle. That is, in order for the operation to be valid, BNKB must correspond to a bank different from that of BNKA.

At time t2, after the falling edge of CK, and in response to the addresses received at both times t0 and t1 (i.e., in the same clock cycle), the corresponding banks (BankA and BankB) can be accessed in parallel. This is in contrast to a conventional operation, like that of FIG. 10A, where read accesses are started prior to write accesses initiated in a previous clock cycle.

At time t3, in the next clock cycle, another command can be received on the rising edge of CK directed to address in a bank (BNKx). However, in sharp contrast to conventional operations, there are no bank restrictions on such an access. That is, BNKx can be any bank of the memory device.

It is noted that in some embodiments, a type of access can be restricted according to clock transition type. In a very particular embodiment, read commands can be restricted to rising edges of CK, while write commands are restricted to falling edges of CK. However, in other embodiments any combination of operations can be accommodated on rising and falling clock transitions of a same cycle (e.g., read-read, read-write, write-read, write-write).

Figure 1B:
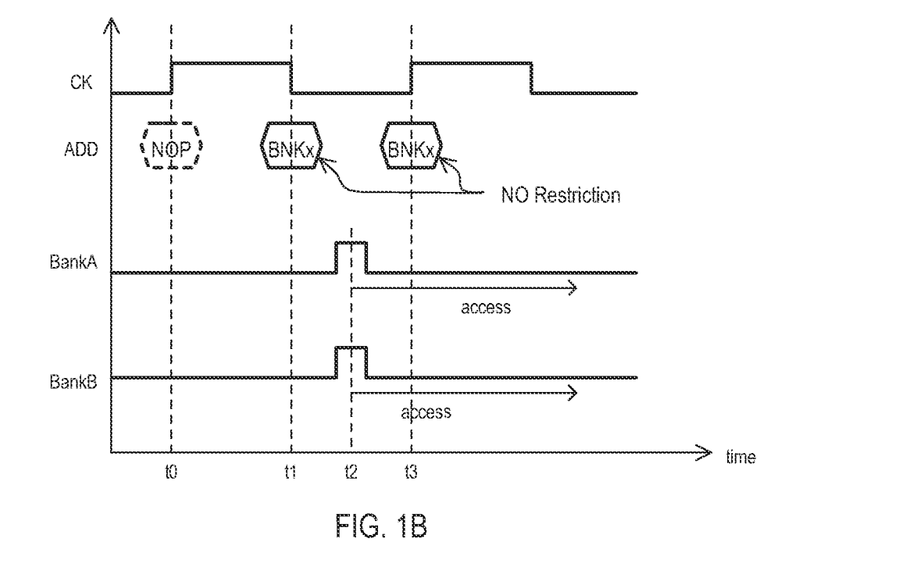

FIG. 1B is a timing diagram showing additional bank accesses and restrictions for a memory device according to an embodiment. FIG. 1B has the same waveforms as FIG. 1A.

FIG. 1B differs from FIG. 1A in that no operation is initiated at time t0. In such an operation, there are no restrictions on which bank is accessed on the falling edge of the same clock cycle (i.e., at time t1). The same freedom of access remains for the subsequent clock cycle (i.e., any bank can be accessed at time t3).

Figure 2A:
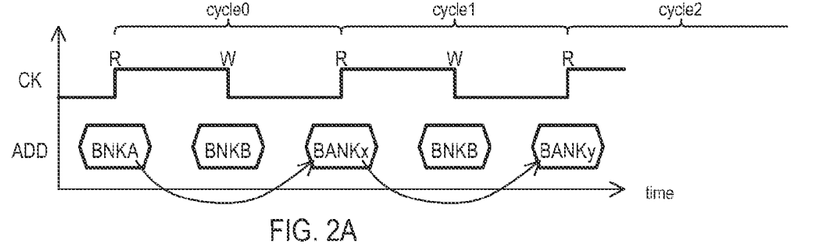
FIGS. 2A and 2B are timing diagrams showing bank access operations according to additional embodiments.
Figure 2B:
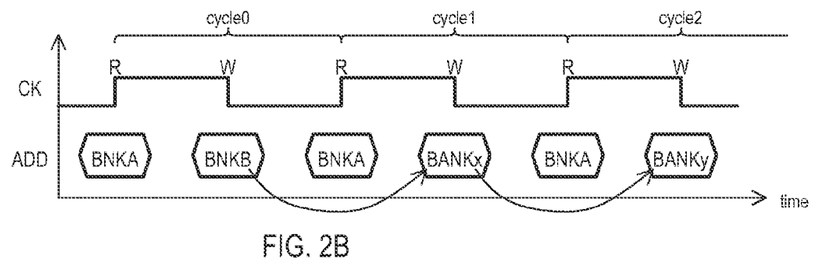

FIGS. 2A and 2B are timing diagrams showing memory accesses according to further embodiments. FIGS. 2A and 2B are timing diagrams showing how the insertions of "no operations" (NOPs) are not needed for accesses according to embodiments. FIGS. 2A and 2B show waveforms for a timing clock CK and latched bank address values ADD. Letters "R" and "W" shown above waveform CK indicate the application of read and write commands. As shown in FIG. 2A, read operations can jump between different banks (BNKA, BNKx, BNKy) in subsequent cycles (cycle0, cycle1, cycle2). Similarly, FIG. 2B shows how write operations can jump between different banks (BNKB, BNKx, BNKy) in subsequent cycles (cycle0, cycle1, cycle2). In all such transitions, a NOP is not inserted. This is in contrast to a conventional approach like that of FIG. 10C.

FIGS. 3A to 3F are a sequence of block schematic diagrams showing intra-cycle address comparison operations according to embodiments. FIGS. 3A to 3F show embodiments in which the only bank address comparison operation (to determine if an access is valid) occurs on the falling edge of the clock cycle. Said in another way, the embodiments shown a memory device in which the only address restriction occurs on the falling edge of a clock cycle, the restriction being that such an address cannot be the same as that received on the rising edge of the same clock cycle.

FIGS. 3A to 3F show a memory device 300 having a first register 302-0, a second register 302-1, and a comparator 304. A first register 302-0 can store at least a bank portion of an address (bank address) received on a rising edge of a timing clock (CK), while a second address register 302-1 can store a bank address received on a falling edge of the timing clock (CK). A comparator 304 can generate an indication (Conflict) in response to a comparison between bank address values.

Figure 3A:
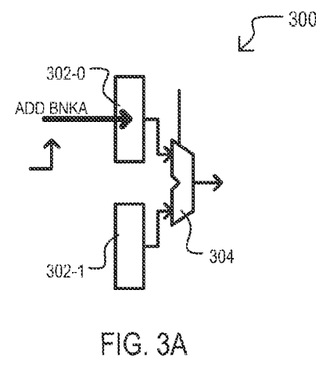
FIGS. 3A to 3F are a sequence of block diagrams showing intra cycle bank address compare operations according to embodiments.
Figure 3B:
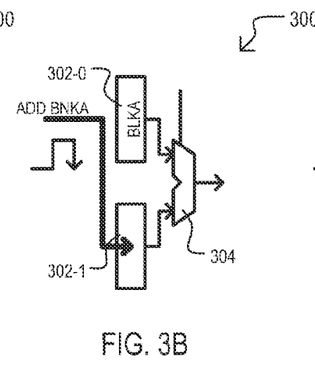
Figure 3C:
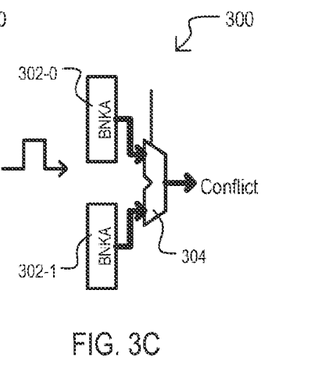

FIGS. 3A to 3C show the generation of indication Conflict, according to one embodiment. FIG. 3A shows operations on a rising edge of signal CK. A first bank address (BNKA) can be stored in first register 302-0.

FIG. 3B shows operations on a falling edge of signal CK. A second bank address (BNKA) can be stored in second register 302-1.

FIG. 3C shows operations after the falling edge of signal CK. A comparator 304 can compare bank addresses in registers 302-0/1. In the embodiment shown, it is assumed that such bank addresses are the same, thus comparator 304 can activate a conflict signal (Conflict) to indicate the bank address received on the falling edge of a clock cycle is the same as that received on a rising edge of the same clock cycle.

Figure 3D:
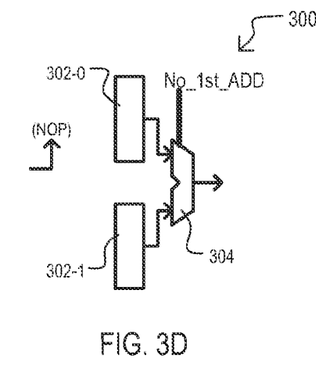
Figure 3E:
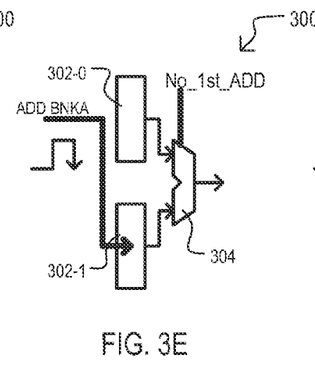
Figure 3F:
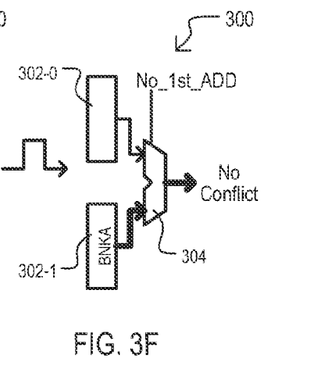

FIGS. 3D to 3F show bank limitation operations when no command is received on a rising edge of a clock cycle. FIG. 3D shows operations on a rising edge of signal CK. No command can be received. In the particular embodiment shown, such an event can activate a control signal No_$1^{st}$_ADD. Such a control signal can disable the compare operations of comparator 304.

FIG. 3E shows operations on a falling edge of signal CK. A bank address (BNKA) can be stored in second register 302-1.

FIG. 3F shows operations after the falling edge of signal CK. A comparator 304 can be disabled, thus a Conflict indication is not generated (represented by "No Conflict" in the figure). Such an operation shows how there can be no bank limitation for addresses received on a falling edge of a clocks signal.

Figure 4A:
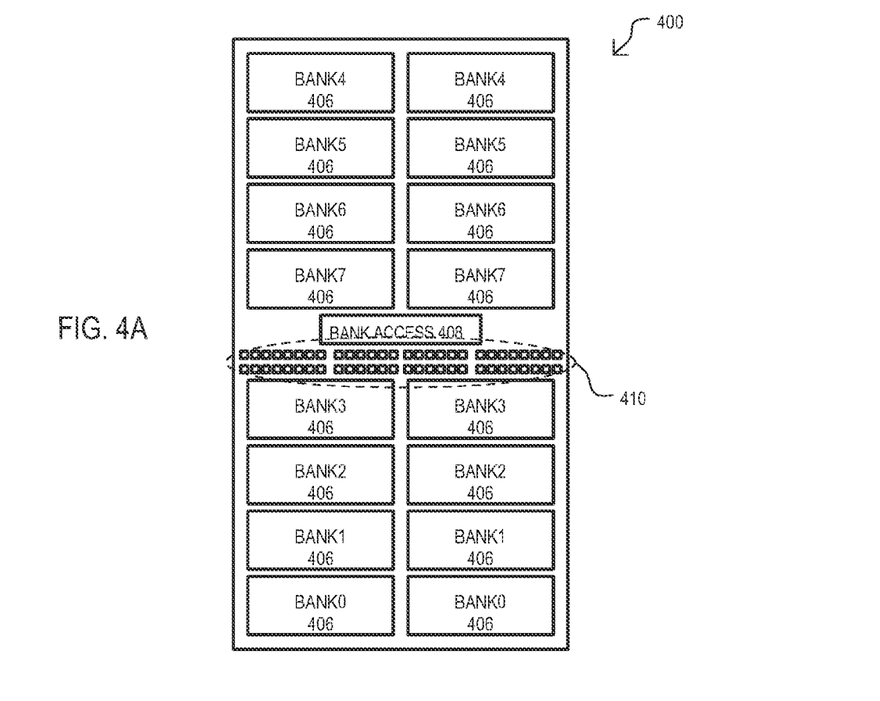
FIG. 4A is a block diagram of a memory device according to an embodiment.

FIG. 4A is a diagram showing the architecture of a memory device according to an embodiment. A memory device 400 can include multiple banks (BANK0 to BANK7), a bank access circuit 408, and input/output (I/O) connections 410. A memory device 400 can execute bank access operations as described herein, or an equivalent. In one embodiment, a memory device 400 can operate at a clock speed of 450 MHz or higher. That is, addresses can be latched on rising and falling edges of a clock running at 1 GHz or faster.

In the embodiment of FIG. 4A, each bank (BANK0 to BANK7) can be formed by two array sections 406. In one particular embodiment, array sections can include static random access memory (SRAM) cells arranged into rows and columns.

A bank access circuit 408 can provide the limited bank address comparison as described for embodiments herein. In some embodiments, bank access circuit 408 can limit accesses to banks (406) by comparing bank addresses received in the same clock cycle, and not with regard to any address received in a previous clock cycle. In a very particular embodiment, bank access circuit 408 can compare a bank address received on the falling edge of a clock cycle to any address received on the rising edge of the same cycle.

I/O connections 410 can provide connections to receive address signals and data signals, including inputs for write data and outputs for read data. In some embodiments, such connections can present a separated bus with separate inputs for write data (D) as compared to outputs for read data (Q). However, in other embodiments, one or more data buses can provide paths for read and write data (DQ buses).

Figure 4B:
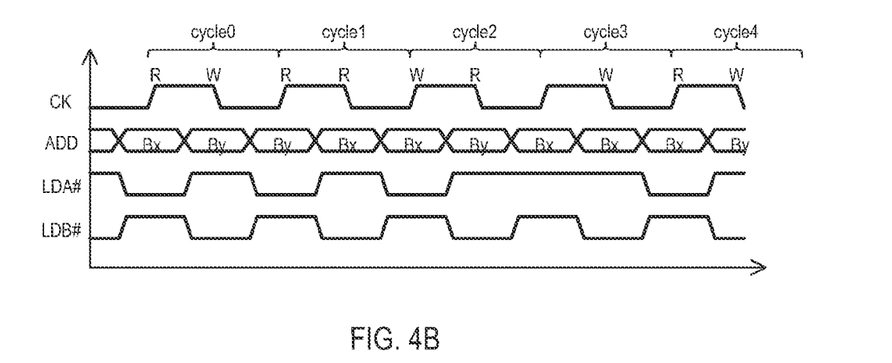
FIG. 4B is a timing diagram showing various combinations of access types for a memory device like that of FIG. 4A.

FIG. 4B is a timing diagram showing a variety of operations that can occur for an embodiment like that of FIG. 4A. FIG. 4B shows waveforms for a timing clock CK, latched bank address values ADD, a first port enable signal LDA#, and a second port enable signal LDB#. Letters "R" and "W" shown above waveform CK indicate the application of read and write commands. LDA# and LDB# are active low signals, with LDA# enabling its ports on rising edges of CK, and LDB# enabling its port on falling edges of CK.

As shown, various combinations of bank addresses (Bx, By) for various combinations of operations (R, W) can be received by the memory device. Unlike conventional approaches, like that of FIG. 10A, a read operation on a rising edge of cycle1 can access the same bank (Bx) as a write operation on the falling edge of previous cycle0. Similarly, a write operation on a rising edge of cycle2 can access the same bank (By) as a read operation on the falling edge of previous cycle1.

It is understood that in the very particular example of operations shown in FIG. 4B, no operation occurs on the rising edge of cycle3, as port enable signal LDA# is inactive (high) on the rising edge of cycle3.

While embodiments above have shown methods and devices that access two banks per cycle, alternate embodiments can access more than two banks per cycle. One such embodiment is shown in FIG. 5.

Figure 5:
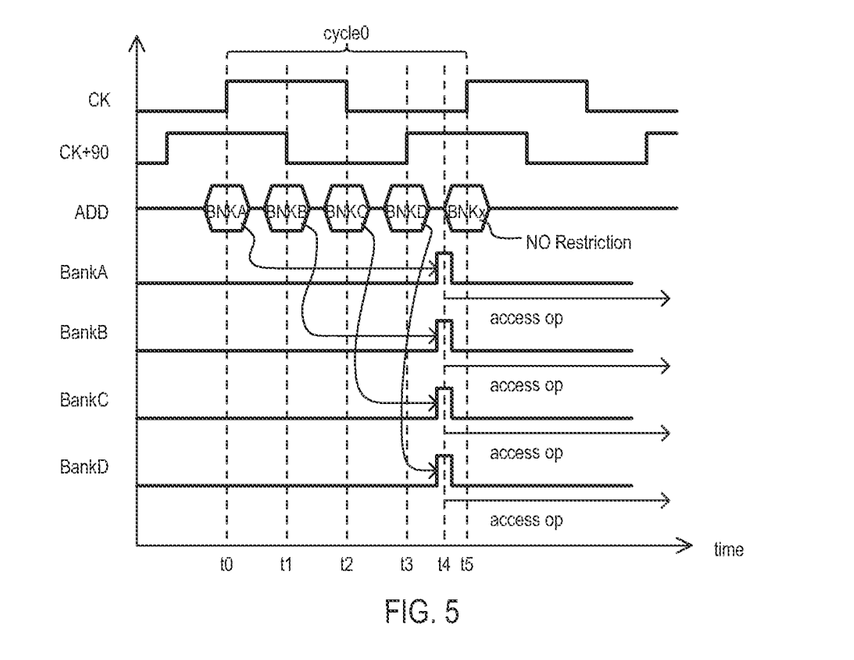
FIG. 5 is a timing diagram showing bank access operations for more than two banks according to one embodiment.

FIG. 5 is a timing diagram showing bank accesses and restrictions for a memory device according to embodiment. FIG. 5 has waveforms for a first timing clock CK, a second timing clock CK+90, latched bank address values ADD, and operations within four different banks (BankA, BankB, BankC, BankD).

Referring to FIG. 5, at time t0 a first command can be received for an address in one bank (BNKA) on a rising edge of CK. Three more commands can be received in the same clock cycle (cycle0) corresponding to bank addresses (BNKB, BNKC, BNKD). Bank restrictions can exist only for intra-cycle accesses. That is, BNKA, BNKB, BNKC, BNKD are different bank addresses. However, addresses in a next clock cycle (e.g., BNKx) can have no bank restrictions.

In some embodiments, a memory device having bank access operations as described herein, can operate with a latency. For example, read data can be output following a read latency (e.g., 8 cycles) after the reception of a read command. In addition, write data can be written into a memory bank after write-to-array latency (e.g., 13 clock cycles) following the initial storing (e.g., latching) of such write data. In such embodiments, write data and corresponding write addresses can be stored prior to write data being actually written into memory cells of the device.

To ensure data coherency, a memory device can include a late write circuit that enables such stored write data to be output in response to read addresses. One such embodiment is shown in FIG. 6.

Figure 6:
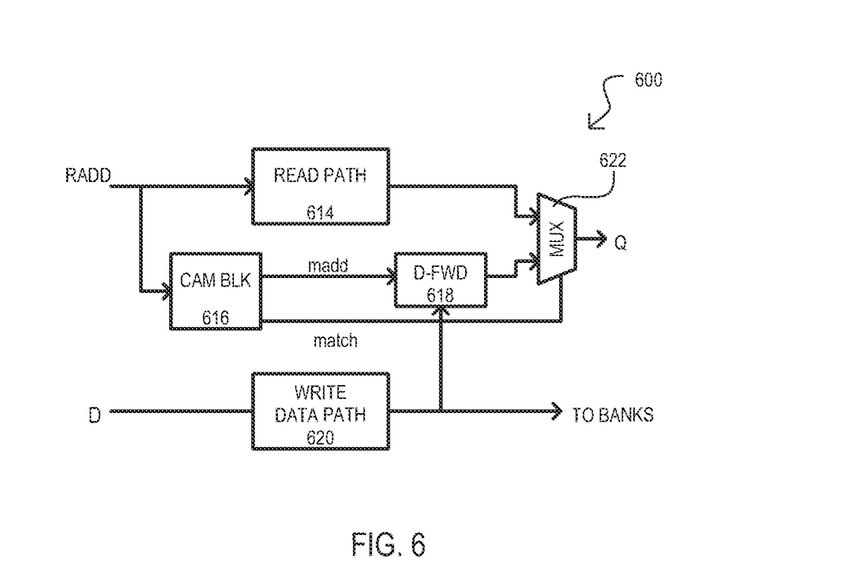
FIG. 6 is a block diagram of a memory device having a late write circuit according to an embodiment.

FIG. 6 shows a memory device 600 that includes a read path 614, a CAM block 616, a write data store 618, a multiplexer (MUX) 622, and a write data path 620. A read path 614 can include memory banks and other suitable circuits (decoders, sense amplifiers, etc.) to enable read accesses to memory cells of a memory cell array (i.e., a standard read access).

A CAM block 616 can store address values for write data that is subsequently stored in memory banks of the device (i.e., is subject to a write-to-array latency). A CAM block 616 can compare a received read address to such stored write addresses to see if the read operation is intended for a location subject to a future write operation. A write data store 618 can store write data accessible by data output from a CAM block 616. A write data path 620 can include write data latches and other suitable circuits (e.g., write amplifiers, etc.) for inputting write data to the device.

In response to a read command and address, the read address (RADD) can be applied to read path 614. Such an operation can result in read data being output from a memory bank.

In addition, the read address (RADD) can also be applied to CAM block 616, where it can be compared to stored write addresses, substantially simultaneously. If a read address matches a stored write address, the matching address (madd) can be forwarded to write data store 618 and a match indication (match) can be activated. A match indication (match) can control a MUX 622.

Accordingly, if a read address does not match a write address stored in CAM block 616, a read data value from read path 614 can be output via MUX 622. However, if a read address matches a write address stored in CAM block 616, a write value from write data store 618 can be output via MUX 622 instead of that from a memory bank.

Figure 7:
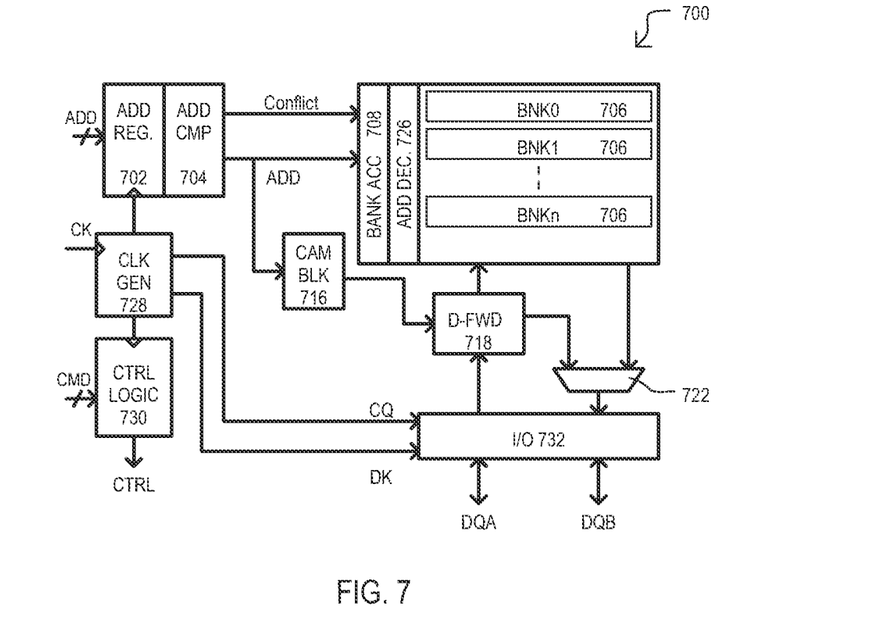
FIG. 7 is a block schematic diagram of a memory device according to another embodiment.

Referring to FIG. 7, a quadruple data rate (QDR) memory device 700 according to one embodiment is shown in a block schematic diagram. Memory device 700 can include a number of banks (BNK0 to BNKn), address register 702, bank address comparator 704, clock generator 728, CAM block 716, control logic 730, write data store 718, read data MUX 722, and an I/O path 732.

Memory blocks 706 can be accessed according to unique block addresses, which in some embodiments can be selected bits of a received address. Address decoder 726 can decode read and write addresses to access storage locations for read and write data (Q and D). In a particular embodiment, memory blocks 706 can have a dual port architecture, enabling simultaneous read and write accesses.

Address register 702 can store addresses received during single clock cycles as described herein, or an equivalent. Address comparator 704 can compare bank addresses received in a same clock cycle. In one particular embodiment, address comparator 704 can compare a bank address latched on a falling edge of a clock signal CK to that latched on the rising edge of the same clock cycle.

CAM block 716, write data store 718 and MUX 722 can operate as described for FIG. 6, comparing a read address to stored write addresses to ensure data coherency.

Clock generator circuit 728 can generate internal clock signals that are in synchronism with, but not necessarily phase aligned to, an input clock (CK). Such internal clock signals can include, but are not limited to, signals for latching address values (ADD), and latching data values in a double data rate (DDR) fashion, including a write data clock DK and read data clock CQ. Read data can be output in response to rising and falling edges of read data clock CQ, and write data can be latched on rising and falling edges of write data clock DK.

Control logic 730 can receive command data and determine when particular operations are to be executed by the memory device 700, including read and write operations. In response to such commands, control logic 730 can generate control signals (CTRL) for controlling various sections of the memory device 700.

It is understood that control logic 730 can include any of various interfaces. For example, in some embodiments, control logic 730 can have a synchronous SRAM interface. However, in alternate embodiments, control logic 730 can have a dynamic RAM (DRAM) type interface, latching bifurcated addresses (e.g., row addresses and column addresses) in response to particular control signals (e.g., /RAS, /CAS signals).

In addition or alternatively, while FIG. 7 shows two bi-directional data paths DQA/B (e.g., data ports), other embodiments can include separate read and write data buses, and more than two data ports. Further, alternate embodiments can include more than one address bus, for a very-wide I/O type memory device.

While the above embodiments have shown various devices, circuits and methods, additional methods will now be described with reference to flow diagrams.

Figure 8:
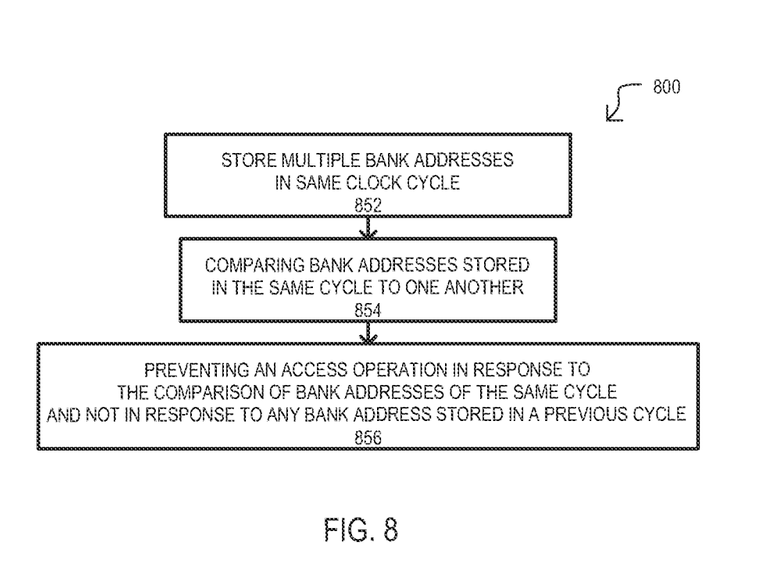
FIG. 8 is a flow diagram of a method according to an embodiment.

FIG. 8 is a flow diagram of a method 800 according to an embodiment. A method 800 can include storing multiple bank address in a same clock cycle (852). In some embodiments, such an action can include latching addresses on rising and falling edges of a clock cycle. Further in some embodiments such an action can include storing more than two bank addresses received in a single clock cycle. A method 800 can also include comparing bank addresses stored in the same clock cycle to one another (854). In one very particular embodiment, such an action can include comparing a bank address stored in a falling clock edge to that stored in the rising clock edge of the same clock cycle.

A method 800 can also include preventing an access operation in response to the comparison of bank addresses of the same cycle and not in response to any bank address stored in a previous cycle 856. Such an action is in sharp contrast to conventional approaches that compare a bank address received in one cycle to those received in a previous cycle.

Figure 9:
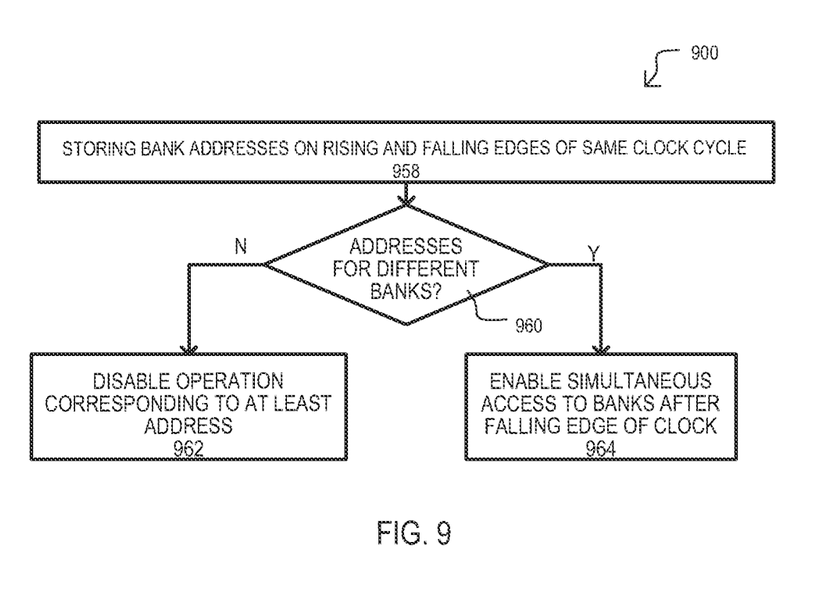
FIG. 9 is a flow diagram of a method according to another embodiment.

FIG. 9 is a flow diagram of a method 900 according to another embodiment. A method 900 can include storing bank addresses on rising and falling of the same clock cycle (958). A determination can be made to see if the bank addresses are for different banks (960). If the bank addresses are not for different banks (N from 960), one or all operations corresponding to the bank addresses can be disabled (962). If bank addresses are for different banks (Y from 960), simultaneous access to the banks can be enabled after the falling edge of the clock cycle (964).

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
storing bank addresses of first and second banks of a memory device, if received, on at least first and second edges of a same clock cycle, respectively; and
if the first and second bank addresses correspond to different banks, starting at the same time the first accesses to each bank in response to said storing that occurs after the second edge of the clock cycle, wherein
any one of the banks of the memory device can be accessed in response to an address stored on a first edge of a next clock cycle.

2. The method of claim 1, wherein:
the first edge is a rising edge and the second edge is a falling edge.

3. The method of claim 1, wherein:
bank addresses stored on first edges of the clock signal correspond to read operations; and
bank addresses stored on second edges of the clock signal correspond to write operations.

4. The method of claim 1, further including:
allowing access to any of the banks in response to the address stored on a second edge of the clock cycle if no bank address is stored on the first edge of the same clock cycle.

5. The method of claim 1, wherein:
preventing an access to the bank corresponding to at least one of the addresses if bank addresses for the same bank are stored on the first and second edges of the same clock cycle.

6. The method of claim 1, further including:
comparing the bank address stored on the first edge of the clock cycle to the bank address stored on the second edge of the clock cycle, after the second edge of the clock cycle to determine if the bank addresses are for the same bank.

7. The method of claim 1, further including:
outputting read data or inputting write data at a frequency that is the same as, but not necessarily phased aligned with, a clock signal having the first and second edges.

8. A memory device, comprising:
a plurality of memory banks;
address compare circuits configured to compare bank addresses received in a same clock cycle, and to not compare such bank addresses to bank addresses received in any previous clock cycle; and
access circuits corresponding to each bank configured to start operations within different banks in parallel and at the same time in response to addresses received in the same clock cycle, where the addresses correspond to different banks.

9. The memory device of claim 8, wherein
the bank addresses received in the same clock cycle include a first address stored on a first edge of the clock cycle and second address stored on a second edge of the same clock cycle.

10. The memory device of claim 9, wherein
the memory device is configured to process read commands in response to addresses stored on the first edge of the clock cycle and process write operations in response to addresses stored on the second edge of the clock cycle.

11. The memory device of claim 9, wherein
the access circuits enable accesses to different banks in parallel after the second edge of the clock cycle, and the second edge follows the first edge in the clock cycle.

12. The memory device of claim 9, wherein the first and second addresses are each a bank portion of respective addresses received in the same clock cycle, and the address compare circuits are configured to compare the first and second addresses received in the same clock cycle after the second edge of the clock cycle, wherein the second edge follows the first edge in the clock cycle.

13. The memory device of claim 8, further including:

a late write circuit configured to compare a received read address to stored write addresses corresponding to write data that have yet to be written into a memory bank, and to output write data when a stored write address matches the received read address.

14. The memory device of claim 13, further including:

the late write circuit comprises a content addressable memory configured to compare a read address simultaneously to stored write addresses.

15. The memory device of claim 8, further including:

address store circuits that store at least the bank addresses on first and second edges of a clock signal, wherein each bank address is a bank portion of a respective address;

write data circuits configured to store data on first and second edges of a write clock signal having a same frequency as, but not necessarily phase aligned with, the clock signal; and read data circuits configured to output data in response to first and second edges of a read clock signal having a same frequency as, but not necessarily phase aligned with, the clock signal.

16. A method, comprising:

storing multiple bank addresses within a same clock cycle;

enabling simultaneous starts of operations within banks of a memory device in response to the stored multiple bank addresses corresponding to different banks; and preventing an operation corresponding to a bank address in response to a comparison of the bank addresses stored within the same clock cycle, and not in response to any bank addresses stored in a previous cycle.

17. The method of claim 16, further including:

storing bank addresses on first and second edges of the same clock cycle; and receiving commands respectively corresponding to each bank address.

18. The method of claim 17, further including:

receiving a command;

if the received command is a write command, storing write data on first and second edges of a same write clock cycle, the write clock being in synchronism with, but not phase aligned with, the clock that stores addresses; and if the received command is a read command, outputting read data in response to first and second edges of a same read clock cycle, the read clock being in synchronism with, but not phase aligned with, the clock that stores addresses.

19. The method of claim 17, wherein:

enabling simultaneous starts of operations within banks of the memory device includes accessing the banks after the second edge of the clock cycle in which the bank addresses were stored; wherein the second edge follows the first edge in the clock cycle.

20. The method of claim 16, wherein:

storing multiple bank addresses includes storing more than two bank addresses of the same clock cycle wherein the second edge follows the first edge in the clock cycle.

* * * * *